United States Patent
Luiset et al.

(10) Patent No.: US 9,981,739 B2
(45) Date of Patent: May 29, 2018

(54) ANTI-EROSION STRUCTURE FOR AIRCRAFTS

(71) Applicants: AIRBUS GROUP SAS, Paris (FR); EUROCOPTER, Marignane (FR)

(72) Inventors: Benjamin Luiset, Courbevoie (FR); Thomas Navarre, Paris (FR); Patrick Boschet, Montigny le Bretonneux (FR); Alain Billard, Exincourt (FR)

(73) Assignees: AIRBUS GROUP SAS, Paris (FR); EUROCOPTER, Marignane (FR)

( * ) Notice: Subject to any disclaimer, the term of this patent is extended or adjusted under 35 U.S.C. 154(b) by 259 days.

(21) Appl. No.: 14/778,665

(22) PCT Filed: Mar. 13, 2014

(86) PCT No.: PCT/EP2014/055000
§ 371 (c)(1),
(2) Date: Sep. 21, 2015

(87) PCT Pub. No.: WO2014/146972
PCT Pub. Date: Sep. 25, 2014

(65) Prior Publication Data
US 2016/0046370 A1    Feb. 18, 2016

(30) Foreign Application Priority Data
Mar. 22, 2013    (FR) ...................... 13 52573

(51) Int. Cl.
*B64C 27/473*    (2006.01)
*C23C 14/06*    (2006.01)
(Continued)

(52) U.S. Cl.
CPC .............. *B64C 27/473* (2013.01); *B64C 3/24* (2013.01); *B64C 3/28* (2013.01); *C23C 14/0605* (2013.01);
(Continued)

(58) Field of Classification Search
CPC ........... B64C 27/473; B64C 3/24; B64C 3/28; C23C 14/0605; C23C 14/0611; C23C 14/0617; C23C 14/0641; F01D 5/288
See application file for complete search history.

(56) References Cited

U.S. PATENT DOCUMENTS

| 2004/0213675 A1 | 10/2004 | Blangetti et al. |
| 2005/0227078 A1 | 10/2005 | Power |

(Continued)

FOREIGN PATENT DOCUMENTS

| EP | 2 172 577 A2 | 4/2010 |
| WO | 2010/044936 A1 | 4/2010 |

OTHER PUBLICATIONS

ISSF The Stainless Steel Family. pp. 1-5. Retrieved from Archive. org with an archive date of Mar. 19, 2013.*

(Continued)

*Primary Examiner* — John E Uselding
(74) *Attorney, Agent, or Firm* — Young & Thompson

(57) ABSTRACT

A structure (10) for aircrafts, includes a part (20) including a metal leading edge (30), the leading edge (30) being covered by a coating (40) having a thickness which is less than or equal to ten micrometers and having a hardness higher than six hundred in the Vickers hardness test (HV). According to a mode of embodiment, the coating (40) is a multilayer stainless steel coating consisting of a superposition of layers with a low nitrogen gradient and layers with a high nitrogen gradient, the layers having a thickness essentially equal to a micrometer. An aircraft including such a structure is also described.

13 Claims, 2 Drawing Sheets

(51) Int. Cl.
- C23C 14/16 (2006.01)
- C23C 28/02 (2006.01)
- C23C 28/00 (2006.01)
- F01D 5/28 (2006.01)
- B64C 3/24 (2006.01)
- B64C 3/28 (2006.01)
- C23C 14/32 (2006.01)
- C23C 14/34 (2006.01)
- C23C 14/35 (2006.01)

(52) U.S. Cl.
CPC ...... *C23C 14/0611* (2013.01); *C23C 14/0617* (2013.01); *C23C 14/0641* (2013.01); *C23C 14/0652* (2013.01); *C23C 14/16* (2013.01); *C23C 14/165* (2013.01); *C23C 14/325* (2013.01); *C23C 14/3485* (2013.01); *C23C 14/35* (2013.01); *C23C 28/021* (2013.01); *C23C 28/42* (2013.01); *F01D 5/288* (2013.01); *B64C 2027/4733* (2013.01); *F05D 2240/303* (2013.01); *Y02T 50/673* (2013.01)

(56) References Cited

U.S. PATENT DOCUMENTS

| | | |
|---|---|---|
| 2006/0018760 A1 | 1/2006 | Bruce et al. |
| 2006/0029494 A1* | 2/2006 | Bruce .............. F01D 5/288 415/160 |
| 2008/0102296 A1 | 5/2008 | Ghasripoor et al. |
| 2012/0028012 A1* | 2/2012 | Nicholls .............. C23C 14/352 428/213 |

OTHER PUBLICATIONS

International Search Report, dated May 13, 2014, from corresponding PCT application.

Ronghua Wei et al., "Deposition of thick nitrides and carbonitrides for sand erosion protection", Surface and Coatings Technology, Dec. 20, 2006, pp. 4453-4459, vol. 201, No. 7.

Ronghua Wei et al., "Erosion Resistance of Thick Nitride and Carbonitride Coatings Deposited using Plasma Enhanced Magnetron Sputtering", Plasma Processes and Polymers, Jan. 1, 2007, pp. S693-S699, vol. 4, No. S1.

* cited by examiner

ANTI-EROSION STRUCTURE FOR AIRCRAFTS

FIELD OF THE INVENTION

This invention relates to the field of anti-erosion coatings for aircraft leading edges.

This invention aims to bring a solution to the erosion, due to rain and due to sand, of aircraft leading edges (vanes, wings, blades . . . ).

The leading edge can consist of a metal (steel or the like) that is harder than the structure that supports it. However, it is nonetheless subject to erosion that leads to its replacement before the end of service life.

STATE OF THE ART

A problem that arises today is the following: the leading edges of helicopter blades suffer mainly from erosion due to rain, and it is necessary to replace these leading edges before the end of service life of the blade. In addition, no common solution to erosion due to rain and to erosion due to sand exists, particularly for helicopter blades.

The challenge is multifaceted since erosion represents a cost in maintenance and in repairs, as well as an operational cost due to the aerodynamic losses that the erosion causes. Finally, the placement of temporary protection against sand erosion represents a significant cost for the user.

Today, a need exists for a solution that retards rain erosion and that would also be effective for sand erosion.

Currently, helicopter blades are clad with a metal strip. This strip can be made of steel, of titanium, of nickel, or even of a nickel-cobalt alloy. These leading edges are replaced periodically before the end of service life of the blades.

To remedy the problems of erosion, temporary solutions are used. These temporary solutions consist in the application of adhesive tapes or even of polymer films that have the advantage of resisting sand erosion well, but the drawback of not resisting rain. The wings of airplanes can also be protected by paints and lacquers that have the drawback of deteriorating in interaction with the environment (rain, sand, impacts . . . ).

DISCLOSURE OF THE INVENTION

This invention intends to remedy the drawbacks of the prior art by proposing a solution that makes it possible for aircraft to be resistant to both erosion due to sand and erosion linked to rain.

For this purpose, this invention, in its most general sense, relates to a structure for aircraft, characterized in that it comprises a part having a leading edge of metal, said leading edge being covered with a coating having a thickness that is less than or equal to twenty micrometers and exhibiting a hardness that is greater than six hundred in Vickers Hardness (HV).

Thus, the structure for aircraft according to this invention constitutes an improvement that is very significant in relation to the existing solutions for erosion due to rain and that also has the advantage of protecting against erosion due to sand.

Preferably, said coating is a coating of multilayer stainless steel consisting of a superposition of layers with a low nitrogen gradient and of layers with a high nitrogen gradient, said layers having a thickness approximately equal to one micrometer.

This multilayer structure makes it possible to optimize the absorption of shocks because the ductile layers act as dampers. This multilayer structure makes it possible to obtain an even better resistance both to erosion due to sand and to erosion linked to rain.

According to one embodiment, the material of said coating is selected from the following group of materials: titanium, chromium, aluminum, nickel, cobalt, copper, zirconium, iron, manganese, and silicon with nitrogen and carbon inputs.

According to a variant, said coating consists of TiCrAlN.

According to one embodiment, said coating consists of a metal gum of CuZr.

According to another embodiment, said coating consists of carbon having a diamond structure: "Diamond-Like-Carbon (DLC)" in English terminology.

According to another embodiment, said coating consists of stainless steel in the following form: FeCrNiMnSiN.

According to a particular implementation, said coating is obtained by a PVD method: Vapor Phase Deposition.

Advantageously, said coating exhibits a hardness of between 1200 and 4000 in Vickers Hardness (HV).

Preferably, said coating has a thickness of between one and ten micrometers.

According to one embodiment, said coating is obtained by a magnetron system.

According to a variant, said coating is obtained by an Arc-PVD method.

According to a particular implementation, said coating is obtained by an HiPMS ("High-Power Impulse Magnetron Sputtering" in English terminology) method.

This invention also relates to an aircraft comprising the structure mentioned above.

BRIEF DESCRIPTION OF THE DRAWINGS

The invention will be better understood using the description, given below purely by way of explanation, of an embodiment of the invention, with reference to the Figures in which.

DETAILED DESCRIPTION OF THE EMBODIMENTS OF THE INVENTION

Figure 1:
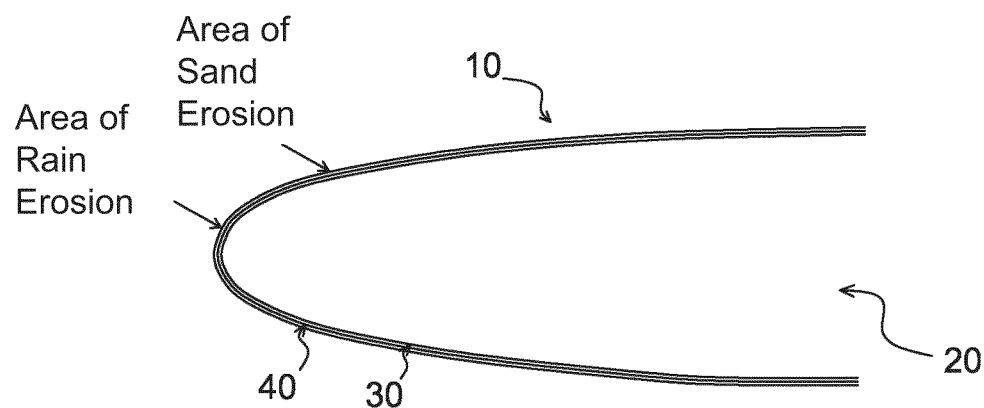
FIG. 1 illustrates a structure for aircraft according to this invention in one embodiment.

FIG. 1 illustrates a structure 10 for aircraft that is consistent with this invention in one embodiment. Said structure 10 comprises a part 20 having a leading edge 30 of metal, said leading edge 30 being covered with a coating 40 that has a thickness that is less than or equal to ten micrometers and that exhibits a hardness that is greater than six hundred in Vickers Hardness (HV).

The areas where erosion due to sand occurs and the areas where erosion due to rain occurs are seen in this FIG. 1.

This invention constitutes an improvement that is very significant relative to the existing solutions for erosion due to rain and that also has the advantage of protecting against erosion due to sand. It is a matter of improving the strength of the current metallic protection (the leading edge 30 of metal) by a coating 40 that is very hard and with a thickness that is less than ten micrometers. According to this invention, the entire area of the leading edge 30, which is subject to erosion due to rain and/or to erosion due to sand, is protected in an identical fashion.

A significant improvement to erosion due to rain can be obtained as soon as the coating 40 attains a thickness on the order of one micrometer. In contrast, tests have shown that, for thicknesses of greater than ten micrometers, the coating 40 can deteriorate quickly.

As soon as the hardness exceeds about 600 HV, a significant improvement to erosion due to rain is obtained. In contrast, this hardness is clearly insufficient to improve erosion due to sand. However, it will be noted that levels of hardness that are higher than that of sand (2000 HV) still improve the resistance to erosion due to rain, provided that they have a smaller thickness. Since, at this level of hardness (>2000 HV), resistance to sand erosion is improved, the idea at the root of this invention is to apply the same coating that is very hard and with a very slight thickness regardless of the area to be protected (rain or sand).

Figure 2:
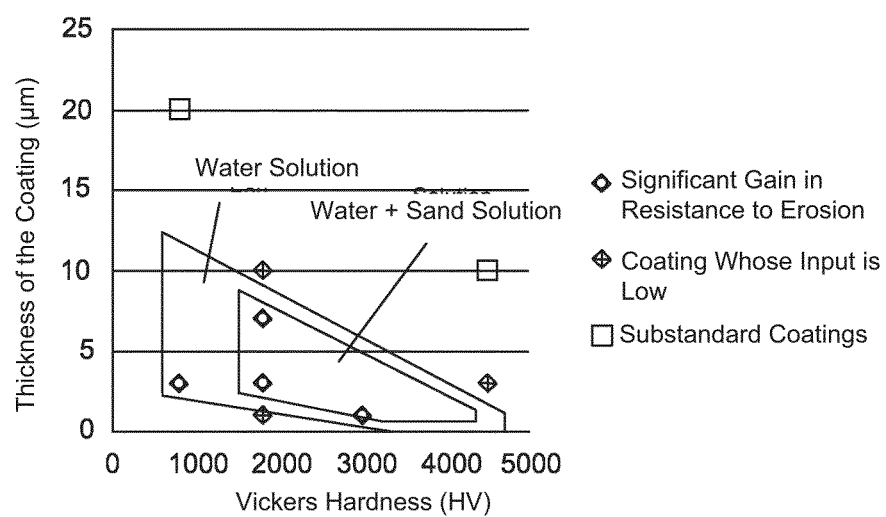
FIG. 2 illustrates the optimum area of the resistance to erosion of the coatings as a function of their thickness and of their hardness.

The optimum thickness seems to depend on the hardness of the coating 40. The graph of FIG. 2 provides the relationship between thickness and hardness for different coatings.

The thin and hard layer makes it possible to resist both erosion due to rain and erosion due to sand. This layer makes it possible to resist erosion due to rain, because it prevents the initiation of cracking and it increases the shock absorption capacity by increasing the surface for distributing stresses within the substrate, and erosion due to sand, because is is harder than sand and prevents the latter from scratching the coating.

PVD (Vapor Phase Deposition) technology makes it possible to obtain thin, dense materials with very high levels of hardness. The characteristics of the coatings and their resistance have been increased using the magnetron system, then using an Arc-PVD, and then an HiPIMS (High-Power Impulse Magnetron Sputtering) system.

PVD technology makes it possible to deposit a very broad range of materials. For optimization, coatings having a base of Ti, Cr, Al, Ni, Co, Cu, Zr, Fe, Bo, Mn, Si with nitrogen and carbon inputs have been developed within the scope of this invention.

Among the coatings developed within the scope of this invention, most notably found are a hard deposit of TiCrAlN, a stainless steel (FeCrNiMnSiN), a metal gum of CuZr, and a Diamond-Like-Carbon (DLC).

Finally, according to one embodiment, the coating 40 is a coating of multilayer stainless steel. This coating 40 has a thickness of approximately ten micrometers and consists of a sequence of layers with a low nitrogen gradient and of layers with a high nitrogen gradient. These layers have a thickness of approximately one micrometer. There is no interfacing between the layers because the transition is performed by means of a composition gradient. This structure makes it possible to optimize the absorption of shocks because the ductile layers act as dampers.

Tests were conducted in the laboratory.

After having performed tests up to five million impacts, initiation was delayed by almost two million impacts.

Also, considering the eroded volume at five million impacts, values equivalent to those obtained on the naked substrate after only two million impacts were found, which represents a gain of three million impacts.

Finally, the multilayer coating makes it possible to achieve a gain of 4.5 million impacts over 5 million impacts, which represents an exceptional resistance to erosion.

Figure 3:
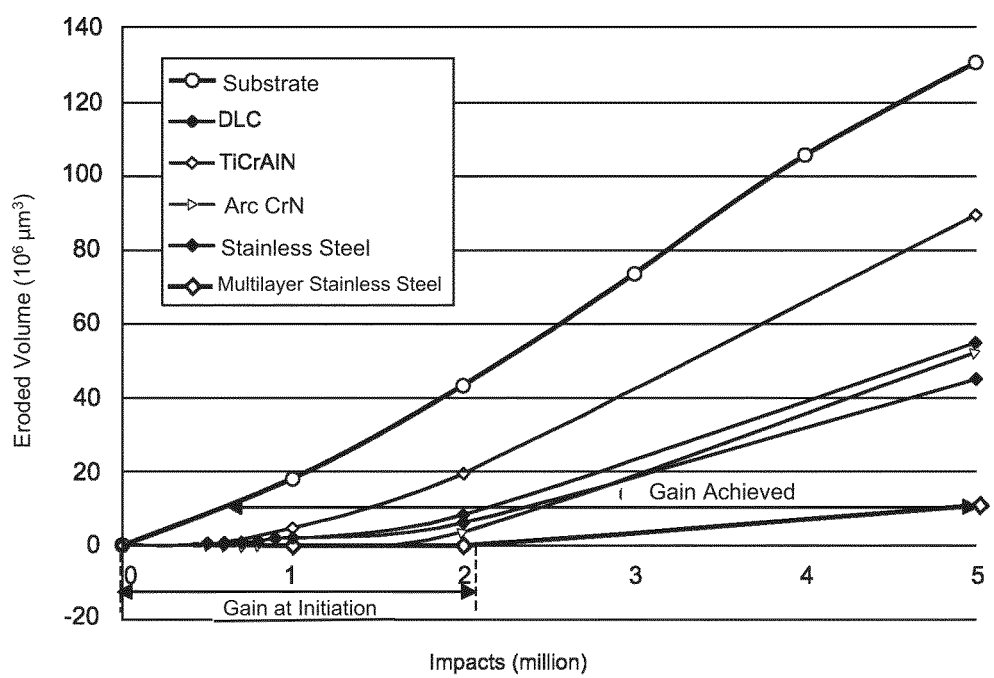
FIG. 3 represents the eroded volume on the various samples expressed as a function of the number of water droplet impacts.

The graph in FIG. 3 makes it possible to view the results obtained.

The solution according to this invention finds a particularly advantageous application in the field of helicopters so as to reinforce the leading edges of the helicopter blades.

This invention applies to other types of aircraft and makes it possible particularly to reinforce the vanes of the turbines of aircraft engines.

The invention is described above by way of example. It is understood that a person skilled in the art is able to produce different variants of the invention without thereby exceeding the scope of the patent.

The invention claimed is:

1. A structure (10) for aircraft, which comprises a part (20) having a leading edge (30) of metal, said leading edge (30) being covered with a coating (40) having a thickness that is less than or equal to twenty micrometers and exhibiting a hardness that is greater than six hundred in Vickers Hardness (HV), said coating (40) being a multilayer stainless steel coating consisting of a superposition of at least two layers, a first layer of the at least two layers having a nitrogen gradient higher than a second layer of the at least two layers, said at least two layers having a thickness approximately equal to one micrometer.

2. The structure (10) for aircraft according to claim 1, wherein the material of said coating (40) is selected from the following group of materials: titanium, chromium, aluminum, nickel, cobalt, copper, zirconium, iron, manganese, and silicon with nitrogen and carbon inputs.

3. The structure (10) for aircraft according to claim 1, wherein said coating (40) consists of TiCrAlN.

4. The structure (10) for aircraft according to claim 1, wherein said coating (40) consists of a metal gum of CuZr.

5. The structure (10) for aircraft according to claim 1, wherein said coating (40) consists of carbon having a diamond structure: "Diamond-Like-Carbon (DLC)" in English terminology.

6. The structure (10) for aircraft according to claim 1, wherein said coating (40) consists of stainless steel in the following form: FeCrNiMnSiN.

7. The structure (10) for aircraft according to claim 1, wherein said coating (40) is obtained by a PVD method: Phase Vapor Deposition.

8. The structure (10) for aircraft according to claim 1, wherein said coating (40) exhibits a hardness of between 1200 and 4000 in Vickers Hardness (HV).

9. The structure (10) for aircraft according to claim 1, wherein said coating (40) is obtained by a magnetron system.

10. The structure (10) for aircraft according to claim 1, wherein said coating (40) is obtained by an Arc-PVD method.

11. The structure (10) for aircraft according to claim 1, wherein said coating (40) is obtained by an High-Power Impulse Magnetron Sputtering method.

12. An aircraft comprising the structure according to claim 1.

13. The structure (10) for aircraft according to claim 1, wherein a transition between said first and second layers comprises a composition gradient.

* * * * *